(12) United States Patent
Dutta et al.

(10) Patent No.: US 12,720,851 B2
(45) Date of Patent: Aug. 25, 2026

(54) CAPACITOR STRUCTURE EMBEDDED WITHIN SOURCE OR DRAIN REGION

(71) Applicant: Intel Corporation, Santa Clara, CA (US)

(72) Inventors: Sourav Dutta, Hillsboro, OR (US); Nazila Haratipour, Portland, OR (US); Vachan Kumar, Hillsboro, OR (US); Uygar E. Avci, Portland, OR (US); Shriram Shivaraman, Hillsboro, OR (US); Sou-Chi Chang, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 66 days.

(21) Appl. No.: 17/936,990

(22) Filed: Sep. 30, 2022

(65) Prior Publication Data

US 2024/0113101 A1 Apr. 4, 2024

(51) Int. Cl.
*H01L 27/06* (2006.01)
*H01L 29/08* (2006.01)
(Continued)

(52) U.S. Cl.
CPC .......... *H10D 84/811* (2025.01); *H10D 1/682* (2025.01); *H10D 30/47* (2025.01); *H10D 30/6729* (2025.01); *H10D 30/6735* (2025.01); *H10D 62/151* (2025.01); *H10D 64/01* (2025.01); *H10D 64/017* (2025.01);
(Continued)

(58) Field of Classification Search
CPC .... H10D 30/014; H10D 30/024; H10D 30/43; H10D 30/47; H10D 30/62; H10D 30/6211; H10D 30/6212; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/01; H10D 64/015; H10D 64/017; H10D 64/018; H10D 64/021; H10D 84/013; H10D 84/0158; H10D 84/017; H10D 84/0193; H10D 84/811; H10D 84/834; H10D 84/853; H10D 1/682
See application file for complete search history.

(56) References Cited

U.S. PATENT DOCUMENTS

2021/0349691 A1* 11/2021 Hekmatshoartabari .................... G06F 7/5443
2022/0122975 A1* 4/2022 Ryu .................... H10D 62/121
(Continued)

*Primary Examiner* — David C Spalla
(74) *Attorney, Agent, or Firm* — Arcane Law PLLC

(57) ABSTRACT

Techniques are provided herein to form a semiconductor device that has a capacitor structure integrated with the source or drain region of the semiconductor device. A given semiconductor device includes one or more semiconductor regions extending in a first direction between corresponding source or drain regions. A gate structure extends in a second direction over the one or more semiconductor regions. A capacitor structure is integrated with one of the source or drain regions of the integrated circuit such that a first electrode of the capacitor contacts the source or drain region and a second electrode of the capacitor contacts a conductive contact formed over the capacitor structure. The capacitor structure may include a ferroelectric capacitor having a ferroelectric layer between the electrodes.

20 Claims, 13 Drawing Sheets

(51) Int. Cl.

| | |
|---|---|
| ***H01L 29/40*** | (2006.01) |
| ***H01L 29/417*** | (2006.01) |
| ***H01L 29/423*** | (2006.01) |
| ***H01L 29/66*** | (2006.01) |
| ***H01L 29/778*** | (2006.01) |
| ***H01L 49/02*** | (2006.01) |
| ***H10D 1/68*** | (2025.01) |
| ***H10D 30/47*** | (2025.01) |
| ***H10D 30/67*** | (2025.01) |
| ***H10D 62/13*** | (2025.01) |
| ***H10D 64/01*** | (2025.01) |
| ***H10D 84/80*** | (2025.01) |
| *H10D 30/01* | (2025.01) |
| *H10D 30/43* | (2025.01) |
| *H10D 62/10* | (2025.01) |

(52) U.S. Cl.

CPC ........... *H10D 30/014* (2025.01); *H10D 30/43* (2025.01); *H10D 30/6757* (2025.01); *H10D 62/121* (2025.01)

(56) References Cited

U.S. PATENT DOCUMENTS

| | | | | |
|---|---|---|---|---|
| 2022/0310638 | A1* | 9/2022 | Cheng ................ | H10D 30/6735 |
| 2023/0268392 | A1* | 8/2023 | Sharma ................ | H10D 64/256<br>257/288 |

* cited by examiner

CAPACITOR STRUCTURE EMBEDDED WITHIN SOURCE OR DRAIN REGION

FIELD OF THE DISCLOSURE

The present disclosure relates to integrated circuits, and more particularly, to the formation of capacitor structures with transistor devices.

BACKGROUND

As integrated circuits continue to scale downward in size, a number of challenges arise. For instance, reducing the size of memory and logic cells is becoming increasingly more difficult. One of the challenges involves routing signal and power lines to each of the various memory and logic cells. Several metal interconnect layers over the semiconductor devices are often used. The tolerances in these layers are very tight and make it difficult to integrate other useful structures within the interconnect layers. Accordingly, there remain a number of non-trivial challenges with respect to integrating other structures along with the semiconductor devices.

Figure 1A:
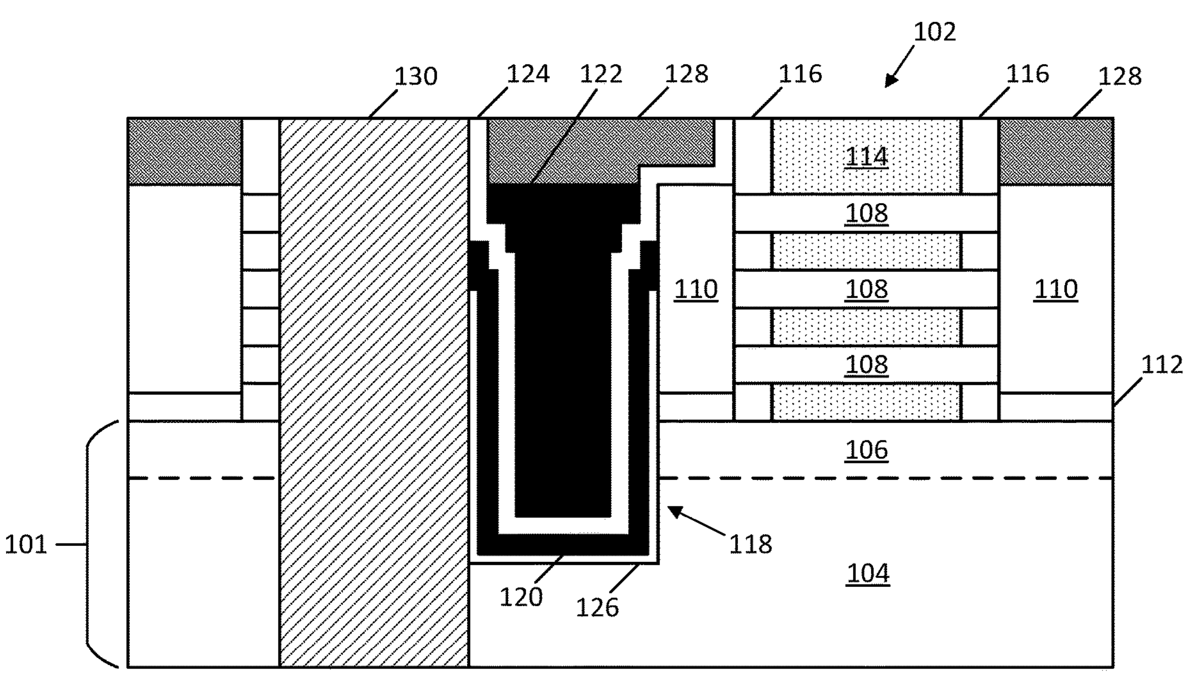
FIGS. 1A-1D are cross-sectional views of different integrated circuit structures having a capacitor integrated with the source or drain region of a semiconductor device, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form a semiconductor device that has a capacitor structure integrated with the source or drain region of the semiconductor device. The techniques can be used in any number of integrated circuit applications including both planar and non-planar transistors, and are particularly useful with respect to logic and memory cells, such as those cells that use finFETs or gate-all-around transistors. In an example, a given semiconductor device includes one or more semiconductor regions extending in a first direction between corresponding source or drain regions. A gate structure extends in a second direction over the one or more semiconductor regions. A capacitor structure is integrated with one of the source or drain regions of the integrated circuit such that a first electrode of the capacitor contacts the source or drain region and a second electrode of the capacitor contacts a conductive contact formed over the capacitor structure. The capacitor structure may extend into the substrate below a bottom surface of the source or drain region, or the capacitor structure may be formed within the source or drain region, such that the first electrode is surrounded on its outer surface by the source or drain region. In another example, the capacitor structure may be a planar structure formed on a top surface of the source or drain region. In another example, both the capacitor structure and the source or drain region extend deep into the substrate below the bottom surface of the gate structure. The capacitor structure may include a ferroelectric capacitor having a ferroelectric layer between the electrodes. Numerous variations and embodiments will be apparent in light of this disclosure.

General Overview

As previously noted above, there remain a number of non-trivial challenges with respect to forming structures within the interconnect region above semiconductor devices. Memory structures are often integrated within the interconnect region above semiconductor devices to maximize the number of semiconductor devices formed on or from the substrate. Some memory structures, such as ferroelectric capacitors, occupy more than one interconnect layer (e.g., several interconnect layers of the interconnect structure over the device layer), which adds process complexity of patterning and etching several layers at once. Furthermore, scalability of the capacitor structures along with their associated semiconductor devices to form bitcells becomes limited due to the need to route signals through the interconnect layers.

Thus, and in accordance with an embodiment of the present disclosure, techniques are provided herein to form capacitor structures integrated with the source or drain regions of semiconductor devices. In this way, a single bitcell (such as an FeRAM bit cell) that includes a semiconductor device and a ferroelectric capacitor coupled to it, can be made more compactly and with less process complexity compared to conventional capacitor structures formed during back-end-of-line (BEOL) processing within the interconnect layers. Several example capacitor structures integrated with the source or drain region are described. In one example, a capacitor structure extends through the source or drain region and deeper into the substrate, thus allowing a first electrode of the capacitor structure to directly contact a side of the source or drain region while a second electrode contacts a conductive contact formed over the capacitor structure. In another example, a capacitor structure is formed completely within a source or drain region such that an outer surface of the first electrode is surrounded by the source or drain region and the second electrode contacts a conductive contact formed over the capacitor structure. In another example, the first electrode of the capacitor is formed on a top surface of the source or drain region while the conductive contact acts as the second electrode over the first electrode. In yet another example, both the capacitor structure and the source or drain region can be made to extend deeper into the substrate below a bottom surface of the gate structure of the semiconductor device. For any of the aforementioned examples, a ferroelectric material may be used between the first and second electrodes to form ferroelectric capacitors as part of FeRAM cells. Note that the conductive contact can generally occupy the same location that the source or drain contact would otherwise have occupied, and thus efficiently uses the available device layer space.

According to an embodiment, an integrated circuit includes a semiconductor region over a substrate and extending in a first direction from a first source or drain region to a second source or drain region, a gate structure extending in a second direction over the semiconductor region, a capacitor structure having a first electrode, a second electrode, and a ferroelectric layer between the first and second electrodes, and a conductive contact over the capacitor structure. The first electrode directly contacts the first source or drain region and the second electrode directly contacts the conductive contact.

According to another embodiment, an integrated circuit includes a semiconductor region over a substrate and extending in a first direction from a first source or drain region to a second source or drain region, a gate structure extending in a second direction over the semiconductor region, a first conductive layer contacting a sidewall portion of the first source or drain region, a ferroelectric layer on the first conductive layer, a second conductive layer on the ferroelectric layer, and a conductive contact on the second conductive layer.

According to another embodiment, an integrated circuit includes a semiconductor region over a substrate and extending in a first direction from a first source or drain region to a second source or drain region, a gate structure extending in a second direction over the semiconductor region, a conductive layer on a top surface of the first source or drain region, a ferroelectric layer on the conductive layer, and a conductive contact on the ferroelectric layer.

According to another embodiment, a method of forming an integrated circuit includes forming a fin comprising a semiconductor material, the fin extending above a substrate and extending in a first direction; forming a source or drain region at an end of the semiconductor material; forming a gate structure extending over the semiconductor material in a second direction different from the first direction; forming a recess through at least a portion of the source or drain region; forming a capacitor structure having a ferroelectric layer within the recess; and forming a conductive contact over the capacitor structure.

The techniques can be used with any type of non-planar transistors, including finFETs (sometimes called double-gate transistors, or tri-gate transistors), or nanowire, nanosheet, and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The source and drain regions may be any epitaxial diffusion region. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a capacitor structure (including one or two electrode layers and a dielectric or ferroelectric layer) within or directly adjacent to a source or drain region. The capacitor structure may be completely embedded within the source or drain region or may extend along a portion of the source or drain region. More generally, such tools may show a capacitor function integrated directly within a device layer space that would otherwise have been at least partially occupied by a source or drain contact and a corresponding source or drain region. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIGS. 1A-1D are each a cross-sectional view of a portion of an integrated circuit that includes a capacitor integrated with a source or drain region of a semiconductor device, in accordance with an embodiment of the present disclosure. One semiconductor device 102 is illustrated in each of FIGS. 1A-1D with different capacitor structures 118, 132, 134, and 136 in FIGS. 1A-1D, respectively. Semiconductor device 102 may be a non-planar metal oxide semiconductor (MOS) transistor, such as a tri-gate or gate-all-around (GAA) transistor, although other transistor topologies and types could also benefit from the techniques provided herein (e.g., forksheet transistors). The examples herein illustrate a semiconductor device with a GAA structure (e.g., having nanoribbons, or nanowires that extend between two source or drain regions).

The semiconductor material used in semiconductor device 102 may be formed from a semiconductor substrate 101. Substrate 101 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 101 can be a semiconductor-on-insulator substrate having a desired semiconductor layer over a buried insulator layer (e.g., silicon over silicon dioxide). Alternatively, substrate 101 can be a multilayer substrate or superlattice suitable for forming nanowires or nanoribbons (e.g., alternating layers of silicon and SiGe, or alternating layers indium gallium arsenide and indium phosphide). Any number of substrates can be used. Substrate 101 may include a bulk region 104 and any number of subfins 106 beneath the semiconductor devices. Each subfin 106 may be formed via etching through a portion of substrate 101 and are aligned beneath corresponding semiconductor devices. In some embodiments, a dielectric fill (not seen in these cross-sections) extends across a bottom portion of the integrated circuit and between adjacent subfins 106. The dielectric fill may include any suitable dielectric material such as silicon oxide. The dielectric fill provides shallow trench isolation (STI) between adjacent semiconductor devices.

The one or more semiconductor regions of semiconductor device 102 may include fins that can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins or deposited into fin-shaped trenches.

In the illustrated example, semiconductor device 102 includes one or more nanoribbons 108 (e.g., semiconductor regions or bodies) extending between source or drain regions 110 in a first direction. Source or drain regions 110 may be formed at the ends of nanoribbons 108 of semiconductor device 102. According to some embodiments, source or drain regions 110 are epitaxial regions that are provided on the semiconductor regions in an etch-and-replace process. In other embodiments source or drain regions 110 could be, for example, implantation-doped native portions of the fins or substrate. Any semiconductor materials suitable for source or drain regions can be used (e.g., group IV and group III-V semiconductor materials). Source or drain regions 110 may include multiple layers such as liners and capping layers to improve contact resistance. In any such cases, the composition and doping of source or drain regions 110 may be the same or different, depending on the polarity of the transistors. Any number of source or drain configurations and materials can be used. According to some embodiments, a bottom dielectric layer 112 may be provided to form an insulating buffer between source or drain regions 110 and subfins 106. Bottom dielectric layer 112 may be any suitable dielectric material, such as silicon oxide, silicon nitride, or silicon oxynitride.

According to some embodiments, semiconductor device 102 includes a gate structure 114 having a gate electrode and a gate dielectric extending over the one or more semiconductor regions of semiconductor device 102 in a second direction to form a transistor gate. A given gate structure may extend over the semiconductor regions of more than one semiconductor device.

As noted above, gate structure 114 extends in the second direction over one or more semiconductor regions of various devices and includes both a gate electrode and a gate dielectric. The gate electrode may include any sufficiently conductive material such as a metal, metal alloy, or doped polysilicon. In some embodiments, the gate electrode includes one or more workfunction metals around the one or more semiconductor regions. In some embodiments, p-channel devices include a workfunction metal having titanium around its one or more semiconductor regions and n-channel devices include a workfunction metal having tungsten around its one or more semiconductor regions. The gate electrode may also include a fill metal or other conductive material around the workfunction metals to provide the whole gate electrode structure. The gate dielectric represents any number of dielectric layers that exist between the one or more semiconductor regions (e.g., nanoribbons 108) and the gate electrode.

According to some embodiments, spacer structures 116 are present on the sidewalls of gate structure 114 and define a gate trench through which gate structure 114 is formed. Spacer structures 116 may include any suitable dielectric material such as silicon nitride or silicon oxynitride.

Turning to the embodiment illustrated in FIG. 1A, a capacitor structure 118 extends along an entire height of source or drain region 110 and extends further into substrate 101 below a bottom surface of source or drain region 110. Capacitor structure 118 may be a ferroelectric capacitor integrated with semiconductor device 102 to form a single bitcell. According to some embodiments, capacitor structure 118 includes a first electrode 120, a second electrode 122, and a ferroelectric layer 124 between first electrode 120 and second electrode 122. Each of first and second electrodes 120/122 may include any suitable conductive material, such as aluminum, tungsten, cobalt, molybdenum, ruthenium, titanium, tantalum, copper, or any alloys thereof. Ferroelectric layer 124 may include any suitable ferroelectric materials (e.g., lead titanate or PTO, lead zirconate titanate or PZT, lead lanthanum zirconate titanate or PLZT, barium titanate or BTO, hafnium oxide doped with any of silicon zirconium aluminum or scandium such as HZO, and oxides with high polarization charge density such as aluminum scandium nitride or AlScN). In one such embodiments, ferroelectric layer 124 includes oxygen and hafnium. In some other such embodiments, ferroelectric layer 124 is doped with one or more of silicon, zirconium, aluminum, or scandium to name a few examples. In some other such embodiments, ferroelectric layer 124 includes aluminum, scandium, and nitrogen.

According to some embodiments, a dielectric layer 126 is used to provide electrical insulation between capacitor structure 118 and substrate 101. Dielectric layer 126 may be any suitable dielectric material, such as silicon oxide.

First electrode 120 contacts at least a portion of a sidewall of source or drain region 110, according to some embodiments. The remaining exposed surfaces of source or drain region 110 may then be protected by ferroelectric layer 124. Second electrode 122 is separated from first electrode 120 by ferroelectric layer 124. A conductive contact 128 may be formed over capacitor structure 118 and on second electrode 122 to provide electrical connection to second electrode 122. In this way, the first terminal of capacitor structure 118 is coupled directly to source or drain region 110 and the second terminal of capacitor structure 118 is coupled directly to conductive contact 128 for further routing to the interconnect layers. Conductive contact 128 may include any suitable conductive material, such as aluminum, tungsten, cobalt, molybdenum, ruthenium, titanium, tantalum, copper, or any alloys thereof.

According to some embodiments, a fin isolation structure 130 is present adjacent to capacitor structure 118. Fin isolation structure 130 may be formed through an adjacent semiconductor device, such that fin isolation structure 130 is present in place of the semiconductor regions and gate structure of the semiconductor device. Fin isolation structure 130 may be any suitable dielectric material. In some embodiments, fin isolation structure 130 is a low-K dielectric material. Some examples of low-K dielectrics include silicon oxide, silicon nitride, or silicon oxynitride. According to some embodiments, first electrode 120 also contacts a sidewall portion of fin isolation structure 130. Furthermore, ferroelectric layer 124 may also contact a sidewall portion of fin isolation structure 130. In the absence of fin isolation structure 130, first electrode 120 could contact another source or drain region of an adjacent semiconductor device or even the semiconductor regions of the adjacent semiconductor device, which may be undesirable. However, in some embodiments, another semiconductor device is present in place of fin isolation structure 130 and also having a source or drain region coupled to capacitor structure 118.

Figure 1B:
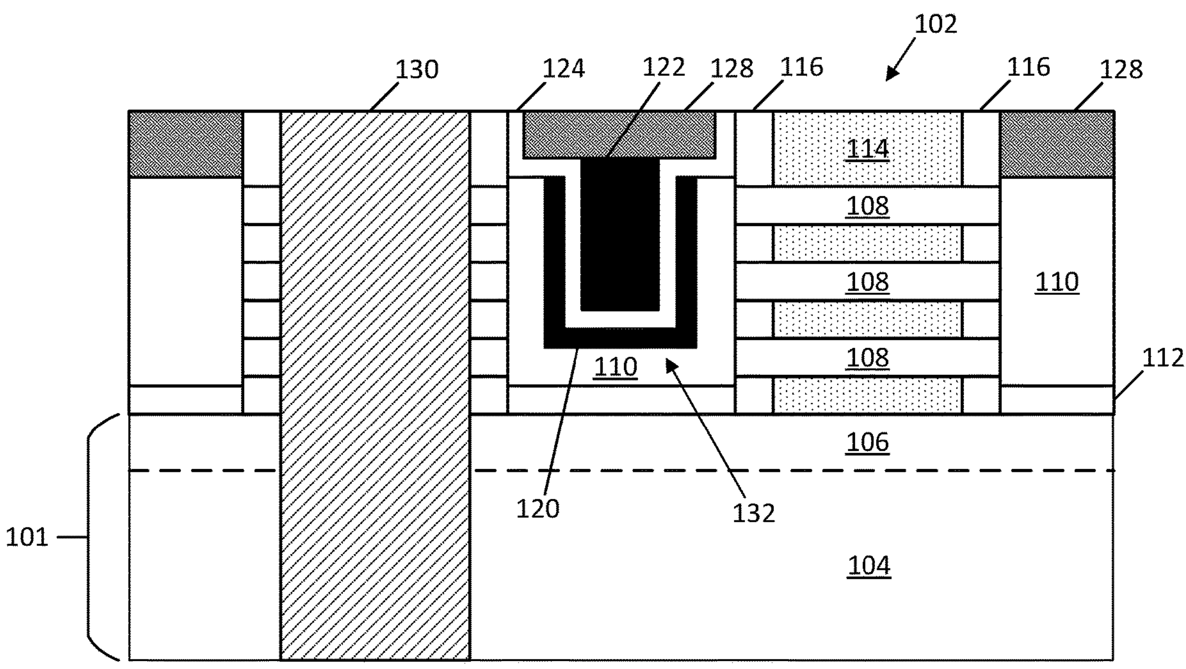

Turning to the embodiment illustrated in FIG. 1B, another example capacitor structure 132 is provided within source or drain region 110. Many of the same elements discussed above are labeled the same in FIG. 1B. As such, capacitor structure 132 includes a first electrode 120 and a second electrode 122 with a ferroelectric layer 124 between the first and second electrodes. According to an embodiment, capacitor structure 132 does not extend past the bottom surface of source or drain region 110, such that source or drain region 110 surrounds an outer surface of first electrode 120. Fin isolation structure 130 may still be present through a neighboring semiconductor device, as illustrated, or another semiconductor device may be present in its place.

Figure 1C:
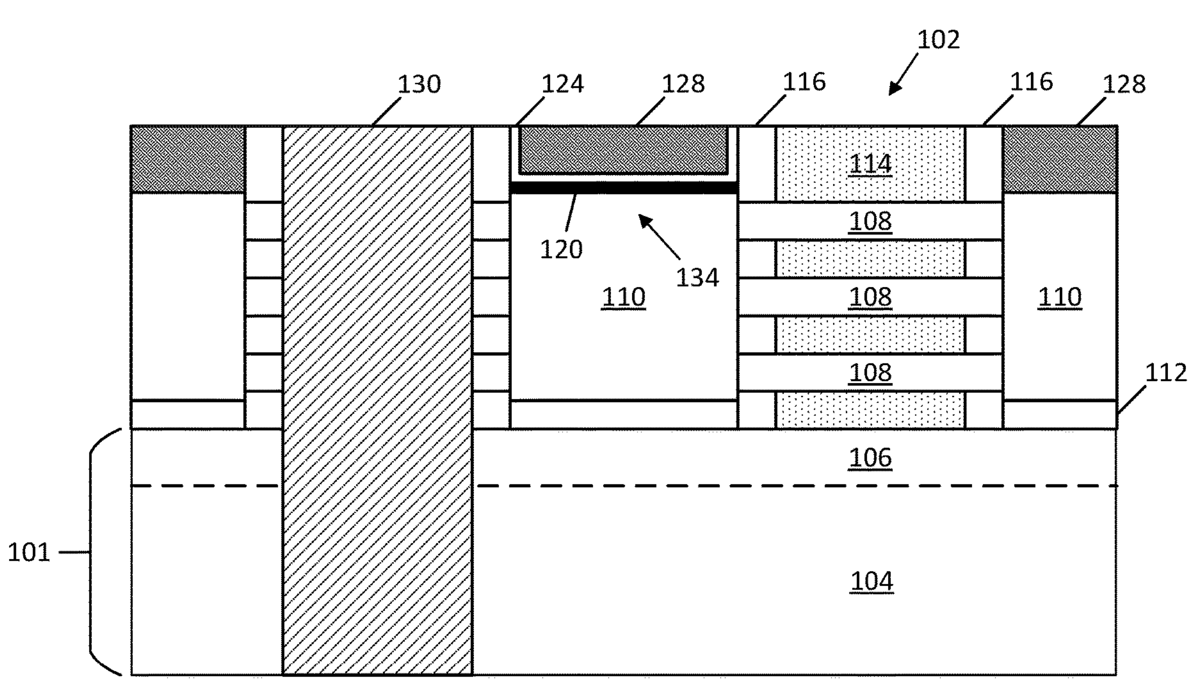

Turning to the embodiment illustrated in FIG. 1C, another example capacitor structure 134 is provided on source or drain region 110. Many of the same elements discussed above are labeled the same in FIG. 1C. As such, capacitor structure 134 includes an electrode 120 and a ferroelectric layer 124. According to an embodiment, capacitor structure 134 does not have a second electrode layer, like second electrode 122, because conductive contact 128 acts as the second electrode 122 of capacitor structure 134. Capacitor structure 134 may be formed on a top surface of source or drain region 110, thus avoiding the need to etch through source or drain region 110 at the cost of a final capacitor structure with a relatively smaller capacitance. Fin isolation structure 130 may still be present through a neighboring semiconductor device, as illustrated, or another semiconductor device may be present in its place.

Figure 1D:
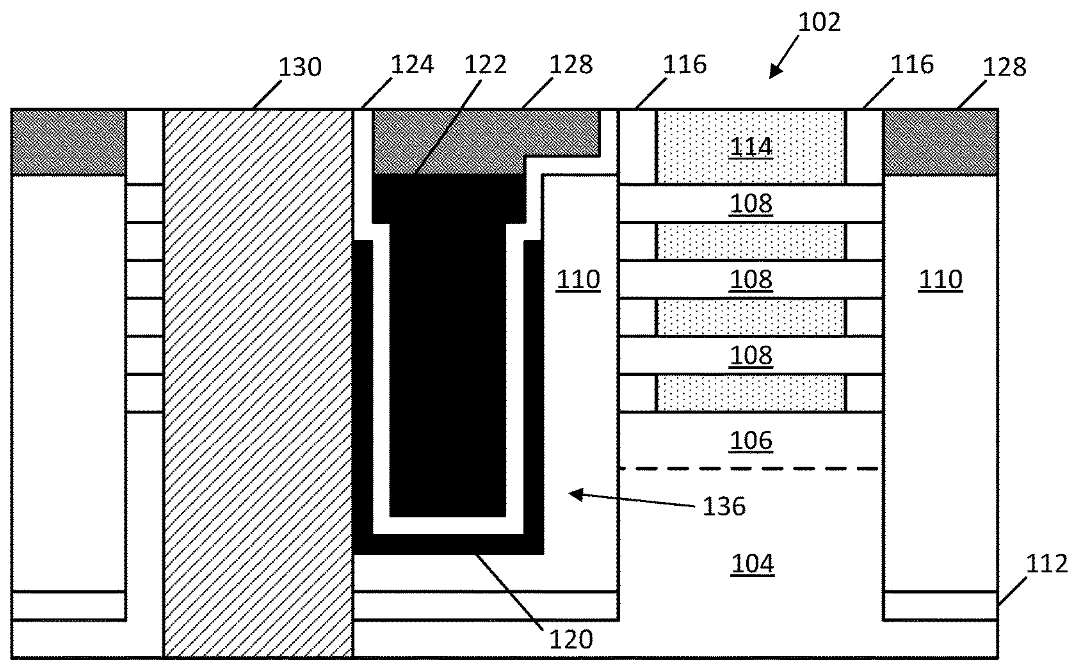

Turning to the embodiment illustrated in FIG. 1D, another example capacitor structure 136 is provided within source or drain region 110. Many of the same elements discussed above are labeled the same in FIG. 1D. As such, capacitor structure 136 includes a first electrode 120 and a second electrode 122 with a ferroelectric layer 124 between the first and second electrodes. Capacitor structure 136 is similar to capacitor structure 118 from FIG. 1A, except that source or drain region 110 also extends down into the substrate beneath the bottom surface of capacitor structure 136. As a result, there is no need to provide an additional dielectric layer 126 for isolation as first electrode 120 does not contact any portion of the substrate. Similar to the device illustrated in FIG. 1A, fin isolation structure 130 may be present directly adjacent to capacitor structure 136.

It should be understood that the depicted capacitor structures are examples and other examples may be configured differently, but still employ the techniques described herein. For any such examples, the fundamental concept remains the same—at least one capacitor electrode directly contacts the source or drain region such that the capacitor is integrated with the source or drain region below the interconnect region above the semiconductor devices, according to some embodiments.

Fabrication Methodology

Figure 2A:
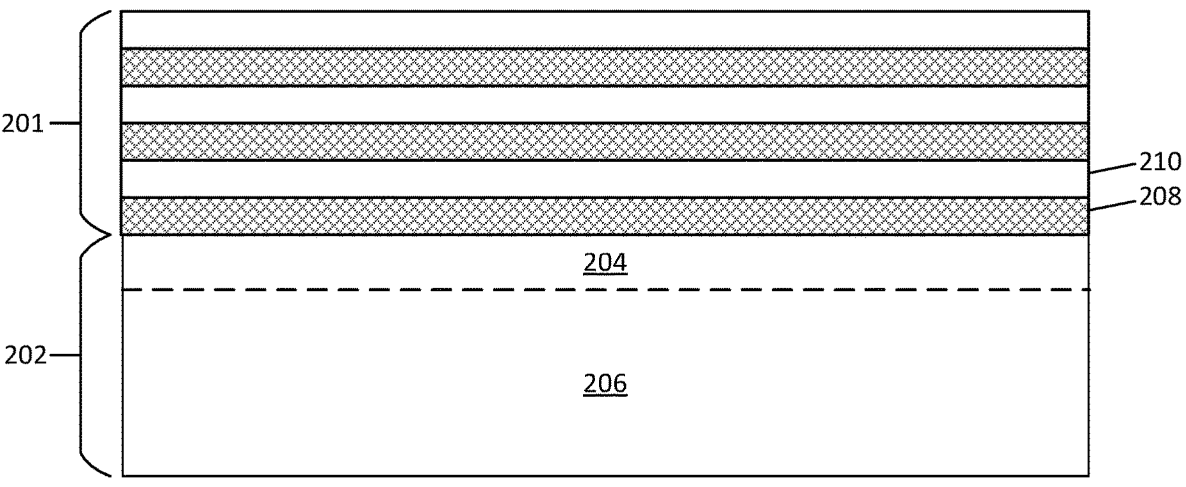
FIGS. 2A-2N are cross-sectional views that illustrate various stages in an example process for forming a semiconductor device having a capacitor integrated with the source or drain region of the semiconductor device, in accordance with some embodiments of the present disclosure.
Figure 2B:
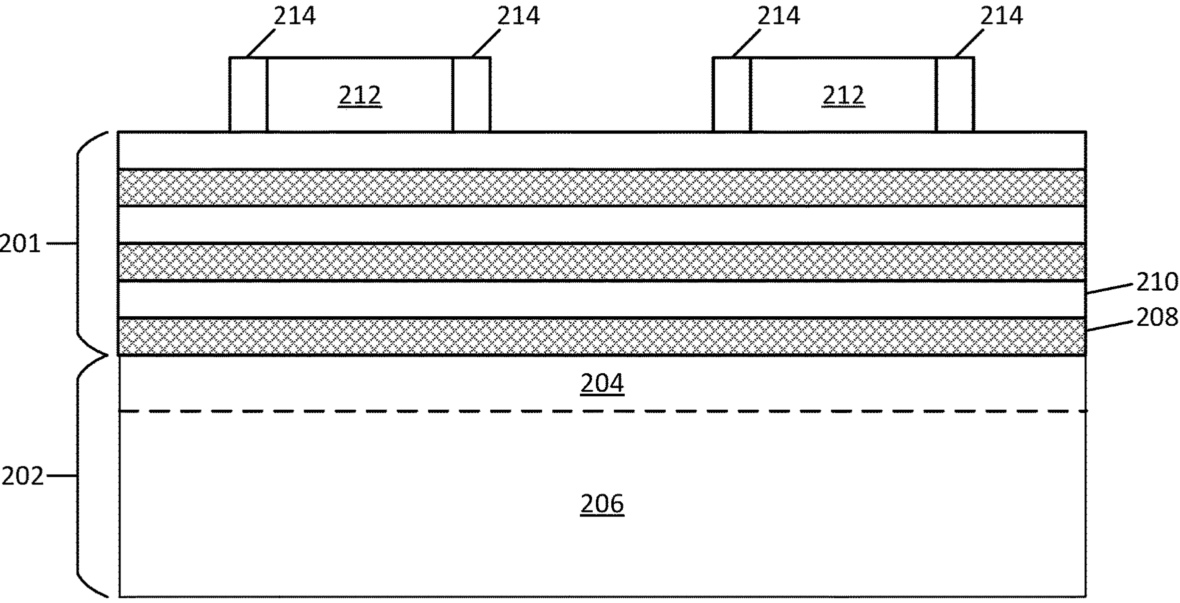
Figure 2C:
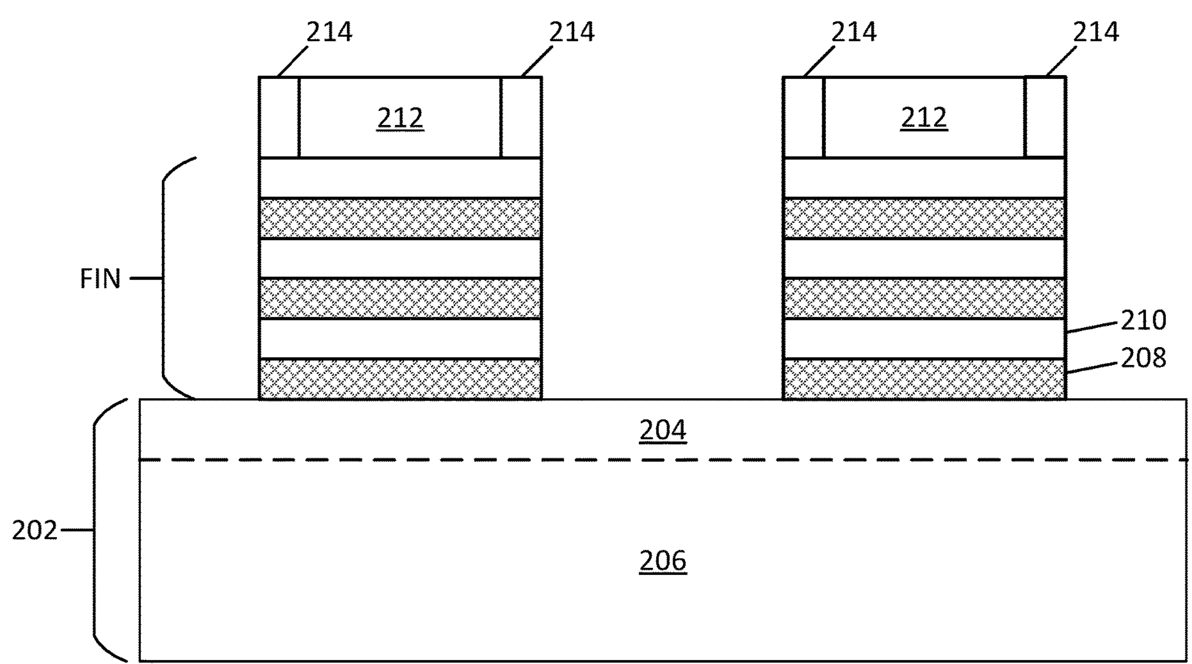
Figure 2D:
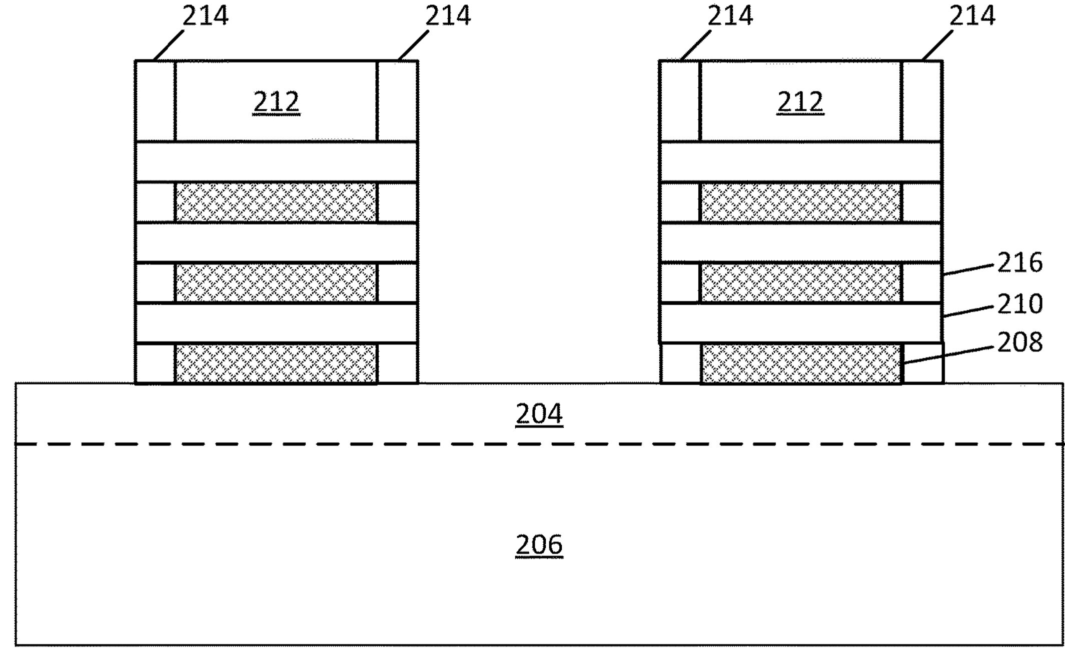
Figure 2E:
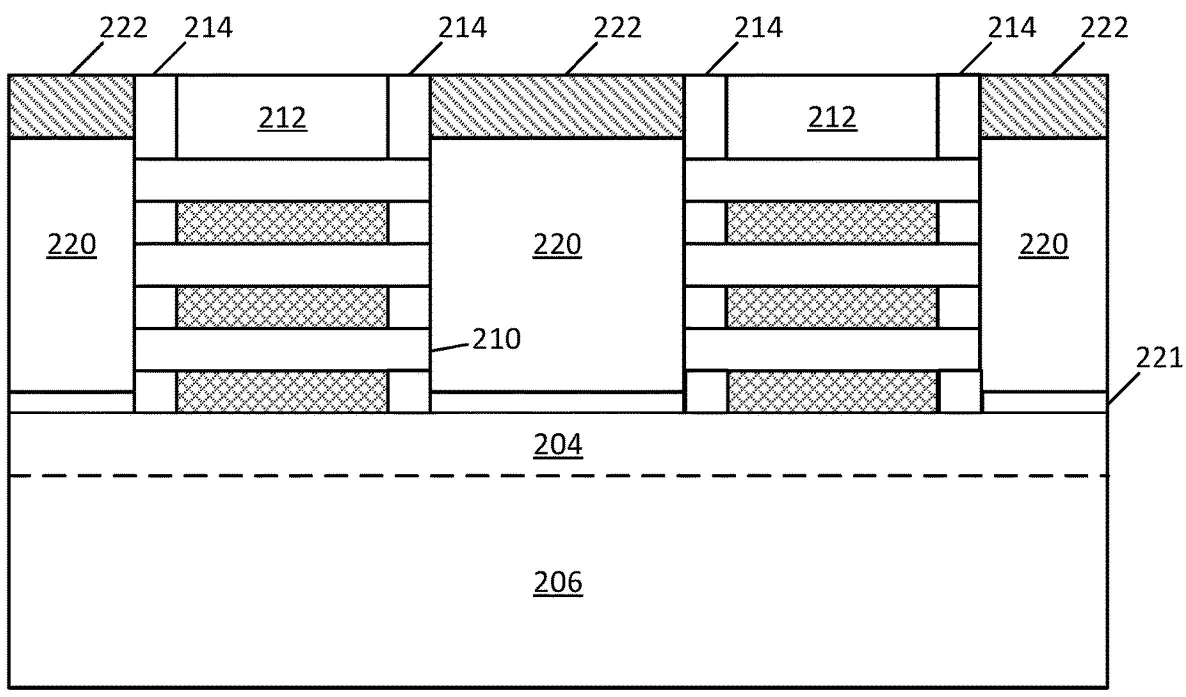
Figure 2F:
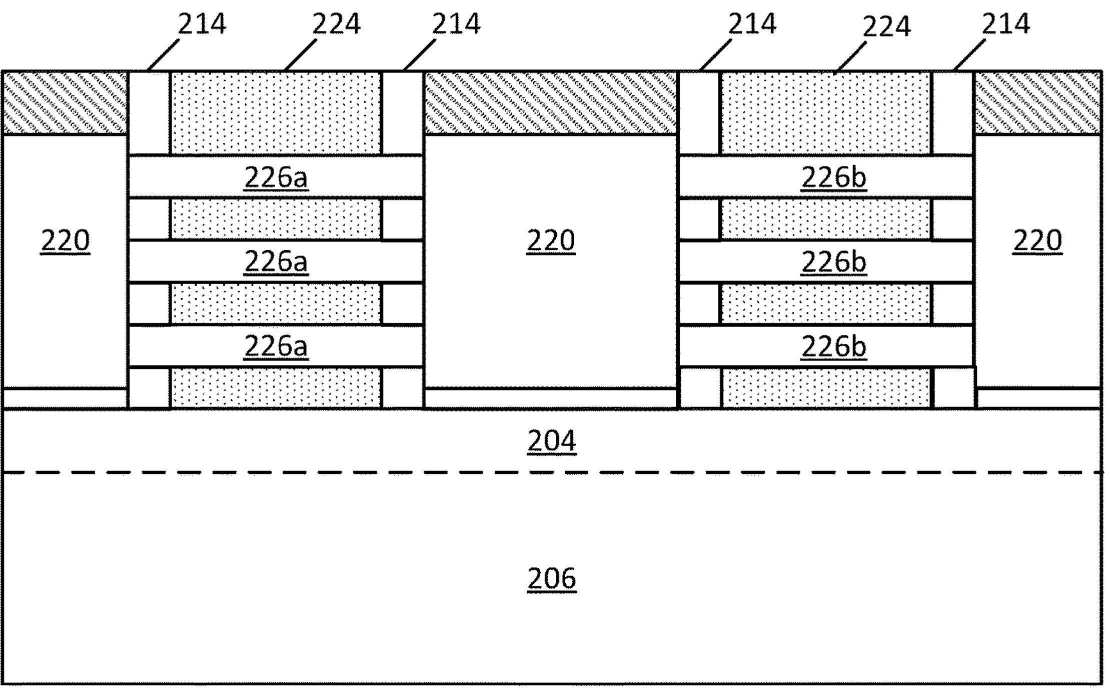
Figure 2G:
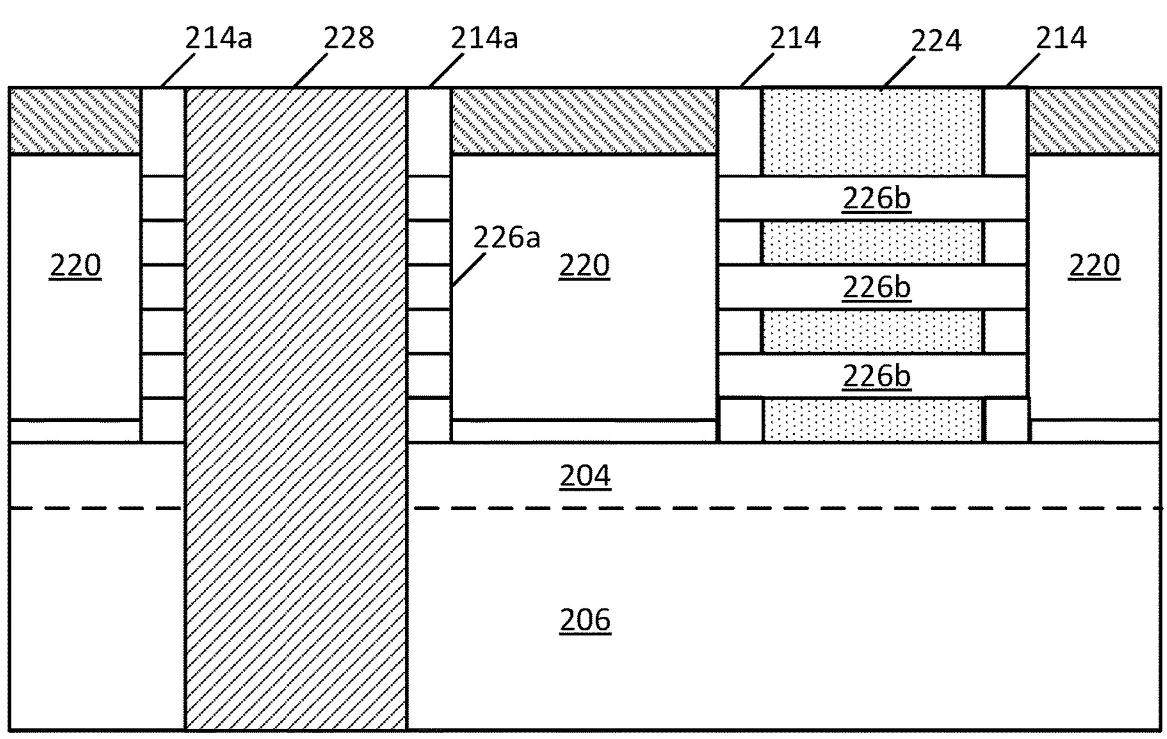
Figure 2H:
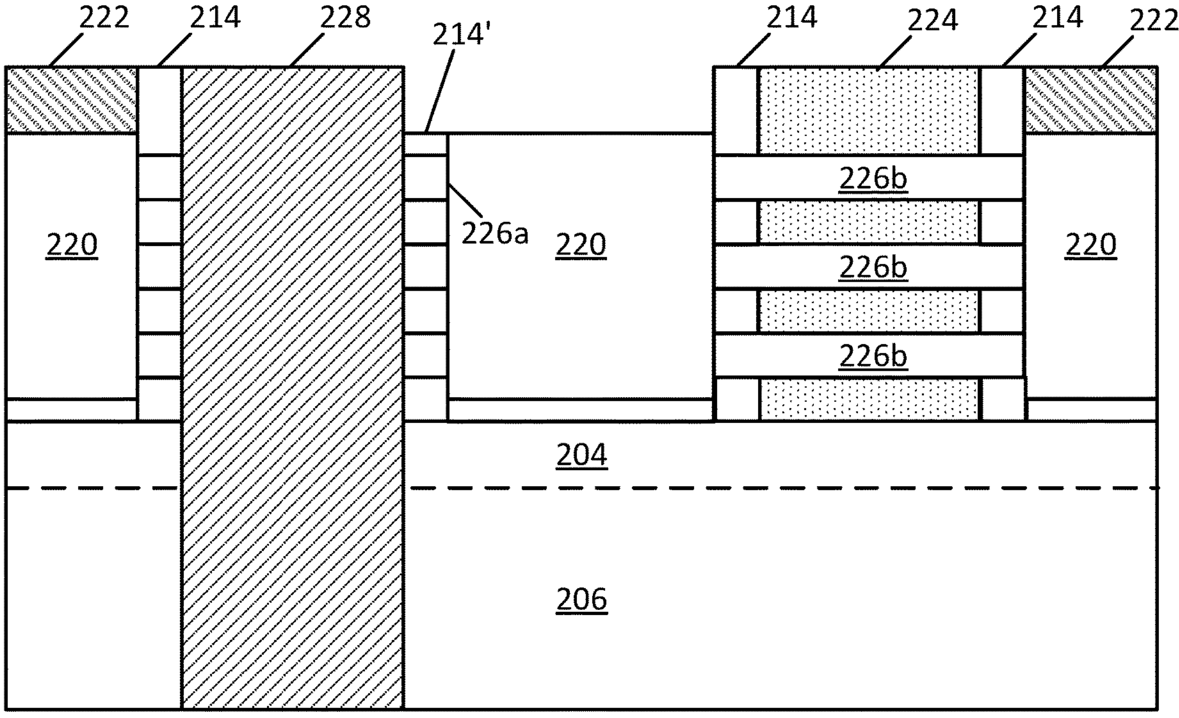
Figure 2I:
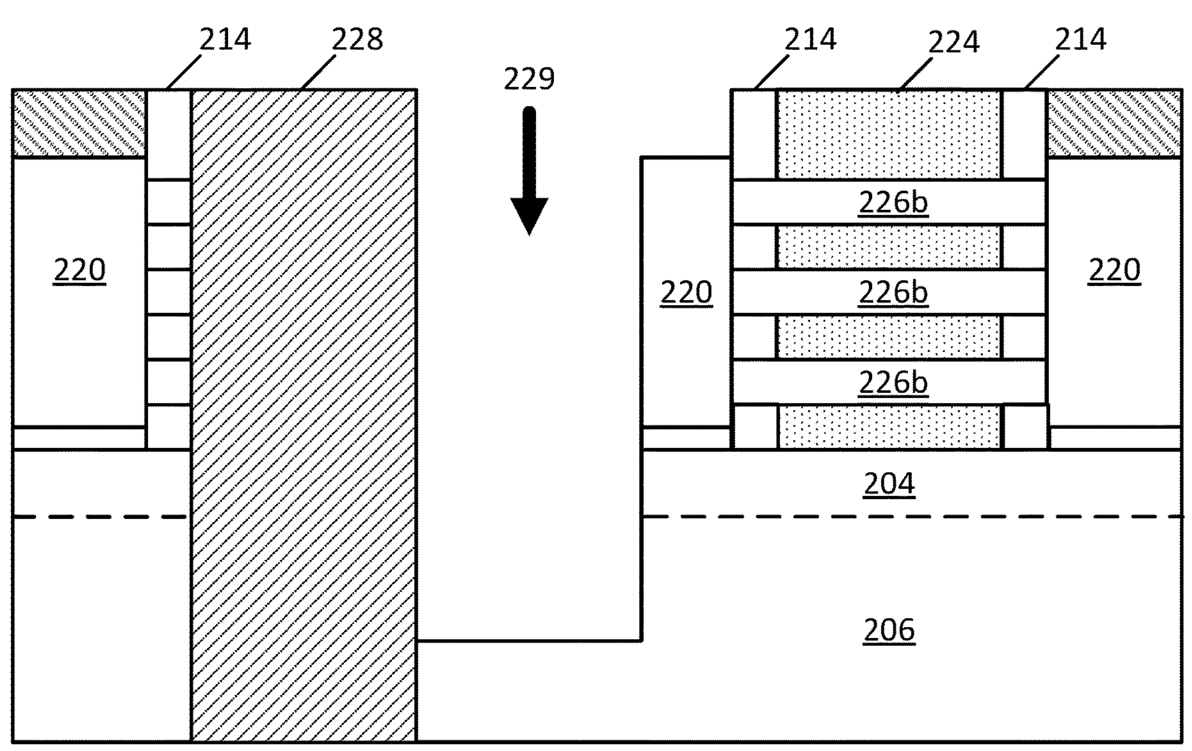
Figure 2J:
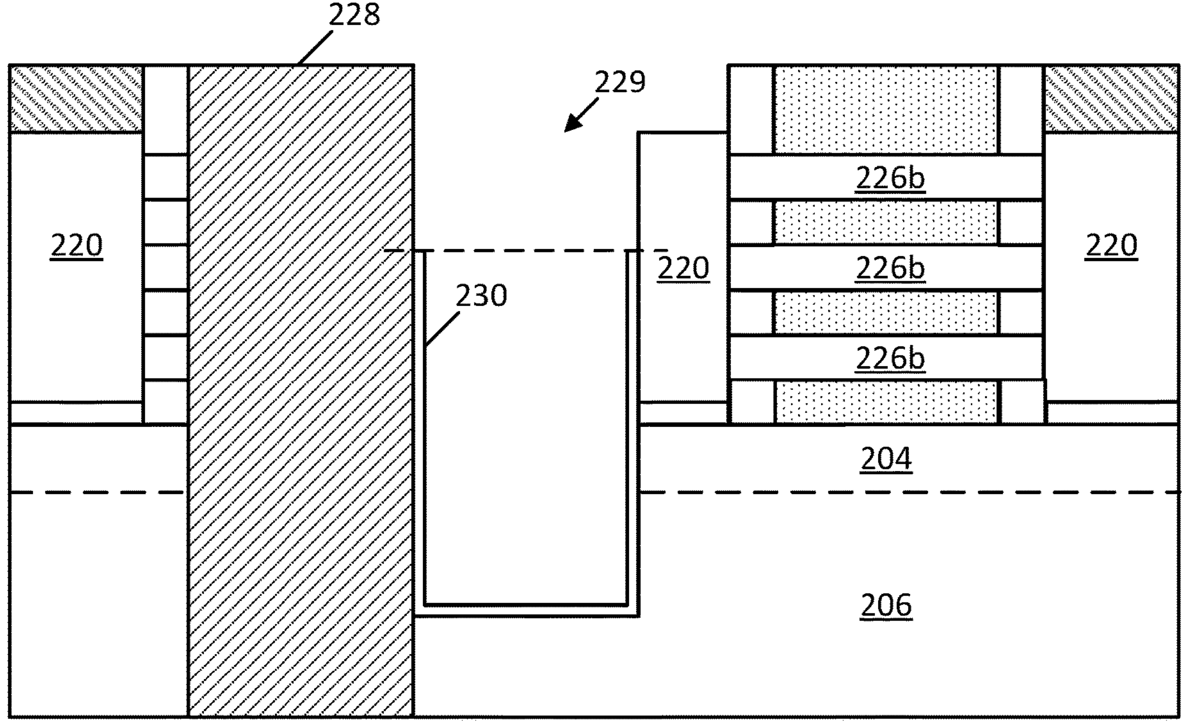
Figure 2K:
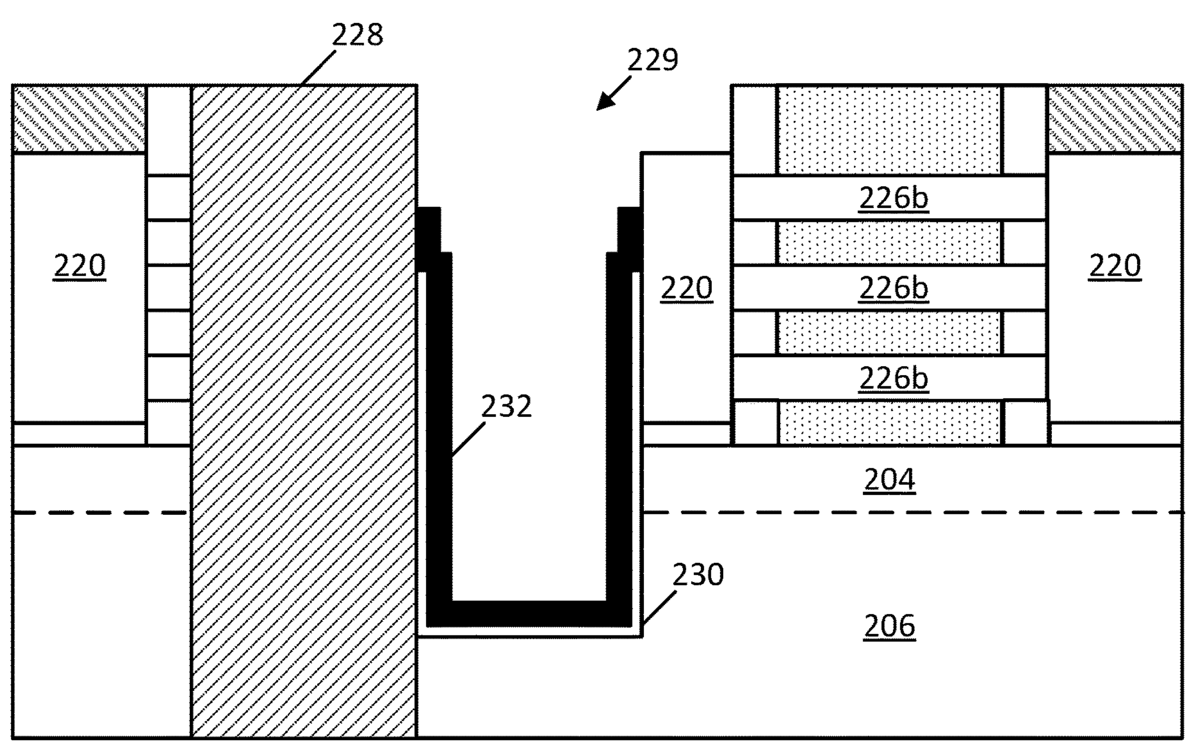
Figure 2L:
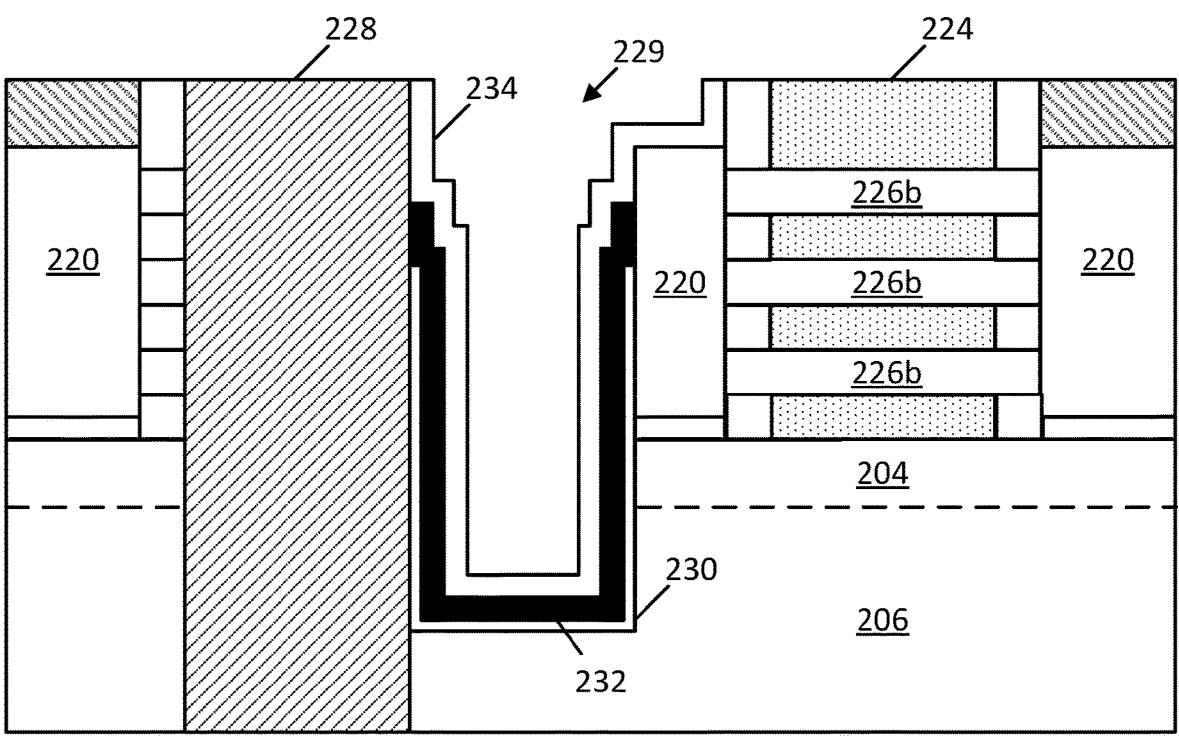
Figure 2M:
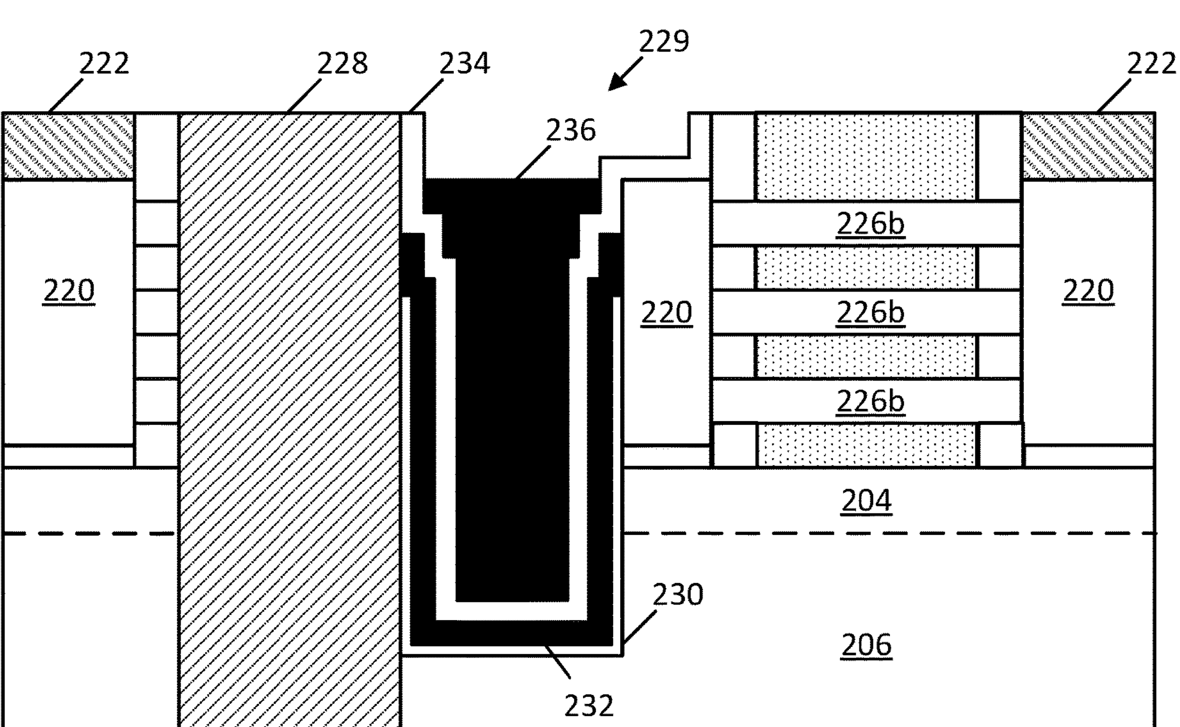
Figure 2N:
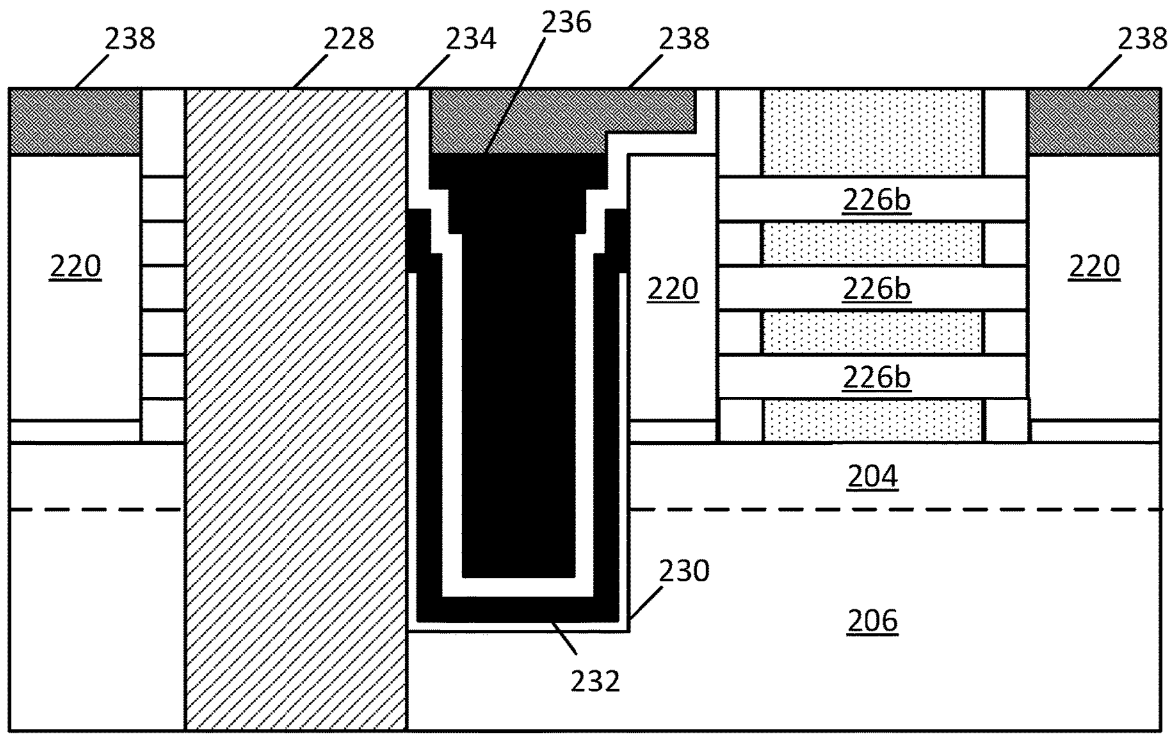

FIGS. 2A-2N include cross-sectional views that collectively illustrate an example process for forming an integrated circuit with a capacitor structure integrated with a source or drain region of a semiconductor device, in accordance with an embodiment of the present disclosure. Each figure shows an example structure that results from the process flow up to that point in time, so the depicted structure evolves as the process flow continues, culminating in the structure shown in FIG. 2N, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated. Although the fabrication of a single capacitor structure is illustrated in the aforementioned figures, it should be understood that any number of similar capacitor structures can be fabricated across the integrated circuit using the same processes discussed herein.

FIG. 2A illustrates a cross-sectional view taken through and parallel to a fin 201 formed over a semiconductor substrate 202. In this example, fin 201 includes alternating layers of material in order to ultimately form nanowires or nanoribbons in a gate-all-around (GAA) structure. In other examples, fin 201 includes a single semiconductor material (e.g., silicon or germanium). Substrate 202 can be, for example, any type of substrate as described above for substrate 101. Substrate 202 may include a subfin 204 and a bulk region 206 with subfin 204 extending above a top surface of bulk region 206.

In this example, fin 201 includes alternating layers of sacrificial layers 208 and semiconductor layers 210. Semiconductor layers 210 may include silicon, germanium, or an alloy thereof. Sacrificial layers 208 have a different material composition than semiconductor layers 210. In some embodiments, sacrificial layers 208 include some combination of silicon and germanium.

While dimensions can vary from one example embodiment to the next, in one example case, the total height of fin 201 may be between 50 nm and 150 nm, and the width of fin 201 (e.g., into and out of the page) can be, for example, in the range of 5 to 100 nm. The thickness of each of semiconductor layer 210 and sacrificial layer 208 may be between about 5 nm and about 25 nm.

FIG. 2B depicts the cross-section view of the structure shown in FIG. 2A following the formation of sacrificial gate structures and spacer structures. One or more sacrificial gates 212 are patterned over fin 201 and run in an orthogonal direction (e.g., along the second direction into and out of the page) to a length of fin 201. One or more sidewall spacer structures 214 are formed along the exposed sidewalls of sacrificial gates 212. Sidewall spacer structures 214 may be formed using an etch-back process where the material is deposited on all surfaces and then directionally etched away from horizontal surfaces leaving the material preferentially on the sidewalls of structures. Sacrificial gates 212 may include any material that can be safely removed later in the process without etching or otherwise damaging the sidewall spacer structures 214 and/or fin 201. Sidewall spacer structures 214 can include any suitable dielectric material, such as silicon nitride. Some portion of sidewall spacer structures 214 may also develop on the sidewalls of any of fins 201, according to some embodiments.

FIG. 2C depicts the cross-section view of the structure shown in FIG. 2B following the removal of the exposed fins not under sacrificial gate 212 and sidewall spacer structures 214. According to some embodiments, both semiconductor layers 210 and sacrificial layers 208 are etched at substantially the same rate using an anisotropic RIE process. As observed in FIG. 2C, the width of sidewalls spacer structures 214 works to define the length of each fin that in turn defines each semiconductor device. In some embodiments, some undercutting occurs along the edges of the fins beneath sidewall spacer structures 214 such that the length is not exactly the same as a sum of the widths of sidewall spacer structures 214 and a width of sacrificial gate 212. In some embodiments, the RIE process may also etch into subfin 204 thus recessing subfin 204 beneath the bottom surface of the fins.

FIG. 2D depicts the cross-section views of the structure shown in FIG. 2C following the formation of inner spacers 216. According to some embodiments, prior to the deposition of inner spacers 216, the exposed ends of sacrificial layers 208 are laterally recessed using an isotropic etching process that selectively etches sacrificial layers 208 as opposed to semiconductor layers 210. Afterwards, a dielectric material is deposited to effectively fill the dimples between semiconductor layers 210, according to some embodiments. The dielectric material can then be etched back using RIE or a wet isotropic etch at least until the ends of semiconductor layers 210 are exposed, thus forming inner spacers 216. In some embodiments, inner spacers 216 wrap around end portions of semiconductor layers 210. According to some embodiments, inner spacers 216 have the same material composition as sidewall spacer structures 214. It should be noted that inner spacers 216 may only be present when using a gate-all-around (GAA) structure having semiconductor nanoribbons or nanowires.

FIG. 2E depicts the cross-section views of the structure shown in FIG. 2D following the formation of source or drain regions 220 between the fins, according to some embodiments. Source or drain regions 220 may be epitaxially grown from the exposed ends of semiconductor layers 210, such that the material grows together or otherwise merges towards the middle of the trenches between fins, according to some embodiments. In other embodiments, the epitaxial growth may only partially merge, or not merge at all thereby leaving space between the laterally adjacent epi-growths in which contact material can be deposited. Such embodiments may further increase contact surface area and thus further lower contact resistance. Further note that epitaxial growth on one semiconductor layer 210 can fully or partially merge with epitaxial growth on one or more other semiconductor layers 210 in the same vertical stack. The degree of any such merging can vary from one embodiment to the next. In the example of a PMOS device, a given source or drain region 220 may be a semiconductor material (e.g., group IV or group III-V semiconductor materials) having a higher dopant concentration of p-type dopants compared to n-type dopants. In the example of an NMOS device, a given source or drain region 220 may be a semiconductor material (e.g., group IV or group III-V semiconductor materials) having a higher dopant concentration of n-type dopants compared to p-type dopants.

According to some embodiments, a bottom dielectric layer 221 may be deposited prior to the formation of source or drain regions 220. Bottom dielectric layer 221 may be any suitable dielectric material, such as silicon oxide, silicon nitride, or silicon oxynitride. Bottom dielectric layer 221 may be provided to provide isolation between source or drain regions 220 and subfin 204. According to some embodiments, a top dielectric fill 222 may be formed over source or drain regions 220 and may extend across multiple source or drain regions in the second direction (e.g., into and out of the page). Top dielectric fill 222 may be any suitable dielectric material, although in some embodiments, top dielectric fill 222 includes the same dielectric material as bottom dielectric layer 221. In one example, each of top dielectric fill 222 and bottom dielectric layer 221 includes silicon oxide. According to some embodiments, a top surface of top dielectric fill 222 may be polished using, for example, chemical mechanical polishing (CMP). The top surface of top dielectric fill 222 may be polished until it is substantially planar with a top surface of sacrificial gates 212 and/or spacer structures 214.

FIG. 2F depicts the cross-section view of the structure shown in FIG. 2E following the formation of nanoribbons 226a/226b and a gate structure 224 around nanoribbons 226a/226b of each semiconductor device, according to some embodiments. Nanoribbons 226a may be the semiconductor regions of a first semiconductor device while nanoribbons 226b may be the semiconductor regions of a second semiconductor device. Depending on the dimensions of the structures, nanoribbons 226a/226b may also be considered nanowires or nanosheets. Sacrificial gates 212 may be removed using any wet or dry isotropic process thus exposing the alternating layer stack of the fins within the trenches left behind after the removal of sacrificial gates 212. Once sacrificial gates 212 are removed, sacrificial layers 208 may also be removed using a selective isotropic etching process that removes the material of sacrificial layers 208 but does not remove (or removes very little of) semiconductor layers 210. At this point, the suspended (sometimes called released) semiconductor layers 210 form nanoribbons 226a/226b that extend between corresponding source or drain regions 220 in the first direction.

As noted above, gate structure 224 includes a gate dielectric and a gate electrode. The gate dielectric may be conformally deposited around nanoribbons 226a/226b using any suitable deposition process, such as atomic layer deposition (ALD). The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on nanoribbons 226a/226b, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

FIG. 2G depicts the cross-section view of the structure shown in FIG. 2F following the formation of a fin isolation structure 228 cutting through nanoribbons 226a of the first semiconductor device, according to an embodiment. Fin isolation structure 228 may be formed through the semiconductor region (e.g., nanoribbons 226a) of the first semiconductor devices within the gate trench between spacer structures 214a.

According to some embodiments, various different materials are first removed to form a recess in which to form fin isolation structure 228. For example, a portion of gate structure 224 (e.g., the gate electrode) may first be removed using an anisotropic etch. The etching process may use gas/plasma chemistries that selectivity remove the conductive material of gate structure 224 as opposed to surrounding dielectric and/or semiconductor materials. In some other embodiments, the anisotropic etch is nonselective and removes all exposed material including all parts of gate structure 224, nanoribbons 226a, and at least a portion of substrate 202. In some other embodiments, different etch processes are carried out to selectively remove various materials within the recess. The etched recess may extend through an entire thickness of subfin 204, in some cases, into at least a portion of the underlying bulk substrate region 206.

Once the recess has been formed, it may be filled with a dielectric material to form fin isolation structure 228. According to some embodiments, fin isolation structure 228 includes a low-K dielectric material, such as silicon oxide, silicon nitride, or silicon oxynitride, to name a few examples.

It should be noted that the process flow described so far in FIGS. 2A-2G are the same for forming each of the structures shown in FIGS. 1A-1D (for the structure of FIG. 1D, a deeper trench is formed between devices for forming the source or drain region). The remaining process flow FIGS. 2H-2N are specific to forming the structure shown in FIG. 1A. However, the formation of the other structures uses similar techniques and materials, but with different lithographical alignment and etching depths to achieve the different structures.

FIG. 2H depicts the cross-section view of the structure shown in FIG. 2G following the removal of top dielectric fill 222 and at least one spacer structure 214' from over a given source or drain region 220, according to some embodiments. Each of top dielectric fill 222 and spacer structure 214' adjacent to fin isolation structure 228 may be removed using an isotropic etching process. It should be noted that all of spacer structure 214' may be removed (e.g., exposing a portion of nanoribbon 226a).

FIG. 2I depicts the cross-section view of the structure shown in FIG. 2H following the formation of a deep recess 229 that cuts through at least an entire height of source or drain region 220 and exposes a sidewall of source or drain region 220, according to some embodiments. An anisotropic RIE process may be performed to form recess 229. According to some embodiments, recess 229 extends through a thickness of subfin 204 and into at least a portion of bulk substrate region 206. Recess 229 may be aligned directly adjacent to fin isolation structure 228, such that the sidewall of fin isolation structure 228 acts as one of the walls of recess 229. In some embodiments, two RIE processes may be performed to form recess 229. A first RIE process may be performed to etch through source or drain region 220, while a second RIE process may be performed to punch through any bottom oxide layers and through subfin 204 and bulk substrate region 206.

FIG. 2J depicts the cross-section view of the structure shown in FIG. 2I following the formation of dielectric layer 230 to cover at least any exposed surfaces of subfin 204 and bulk substrate region 206. Dielectric layer 230 may be any suitable dielectric material, such as silicon oxide, and may have a thickness, for example, between about 3 nm and about 20 nm.

According to some embodiments, dielectric layer 230 is patterned such that it does not extend up the entire sidewall of source or drain region 220. This patterning process involves first depositing dielectric layer 230 on all surfaces using a conformal deposition technique, such as atomic layer deposition (ALD) or chemical vapor deposition (CVD). Next, a sacrificial masking material such as carbon hard mask (CHM) is deposited and recessed within recess 229 to the desired height where dielectric layer 230 is to remain (e.g., at the height indicated by the dashed line). Then, the exposed portions of the dielectric layer are removed and finally the sacrificial masking material is removed (e.g., by way of an ashing process) to leave behind dielectric layer 230 partially covering the sidewalls of recess 229.

FIG. 2K depicts the cross-section view of the structure shown in FIG. 2J following the formation of a first electrode 232, according to some embodiments. First electrode 232 may be deposited directly on dielectric layer 230 via ALD or CVD and may contact at least a portion of a sidewall of source or drain region 220. First electrode 232 may be any suitable conductive material and may have a thickness, for example, between about 3 nm and about 20 nm. According to some embodiments, first electrode 232 is patterned such that it does not extend on every surface within recess 229, but just far enough to contact a portion of source or drain region 220. According to some embodiments, first electrode 232 also contacts a portion of the adjacent fin isolation structure 228. A similar process as that discussed above for patterning dielectric layer 230 may be used to pattern first electrode 232 within recess 229 (e.g., conformally deposit first electrode material; deposit and recess a CHM within recess 229 to the desired height where first electrode 232 is to remain; etch away the exposed portions of the first electrode material; and remove CHM to leave behind first electrode 232 covering layer 230 and contacting a portion of source or drain region 220).

FIG. 2L depicts the cross-section view of the structure shown in FIG. 2K following the formation of a ferroelectric layer 234 within recess 229, according to some embodiments. Ferroelectric layer 234 may be formed directly on first electrode 232 via ALD or CVD, and also on any other exposed surfaces within recess 229, such as on any other exposed surfaces of source or drain region 220. Ferroelectric layer 234 may be, for example, hafnium oxide ($HfO_2$) doped with any one or more of silicon, zirconium, aluminum, or scandium. Any other ferroelectric materials can be used as well, such as those described above. Ferroelectric layer 234 may have a thickness, for example, between about 3 nm and about 20 nm.

Ferroelectric layer 234 may be deposited across all exposed surfaces and a remaining volume of recess 229 can be filled with a sacrificial material, such as CHM. The excess sacrificial material and any portions of the ferroelectric layer outside of recess 229 can be polished back to be planar with a top surface of other devices structures, such as gate structure 224 and fin isolation structure 228. Then, the sacrificial material can be removed (e.g., ashing process) to leave behind ferroelectric layer 234 only along any exposed surfaces within recess 229.

FIG. 2M depicts the cross-section view of the structure shown in FIG. 2L following the formation of a second electrode 236 within recess 229. Second electrode 236 may include the same conductive material as first electrode 232, although any other suitable conductive material may be used as well. According to some embodiments, second electrode 236 may fill a large portion of the remaining volume of recess 229. In some embodiments, a top surface of second electrode 236 is at the same height as or above a top surface of first electrode 232. According to some embodiments, second electrode 236 is deposited to fill the remaining volume of recess 229 and is then recessed back to its final height within recess 229. Note in the example configuration shown that the ferroelectric layer 234 fully isolates first electrode 232 from inadvertent shorting to second electrode 236 or contact 238.

FIG. 2N depicts the cross-section view of the structure shown in FIG. 2M following the formation of conductive contacts 238 over the capacitor structure and over other source or drain regions 220, according to some embodiments. Conductive contacts 238 may be any suitable conductive material, such as aluminum, tungsten, cobalt, molybdenum, ruthenium, titanium, tantalum, copper, or any alloys thereof. In some embodiments, a given conductive contact 238 is formed directly on second electrode 236 within recess 229. Conductive contact 238 may also contact portions of ferroelectric layer 234 within recess 229. In some examples, conductive contact 238 may include a multilayer configuration, such as one that includes one or more resistance-reducing layers and/or barrier layers in addition to fill metal. In any such cases, note how conductive contact 238 can be located in a location similar to other source and drain region contacts, and may be processed with other such contacts.

Figure 3:
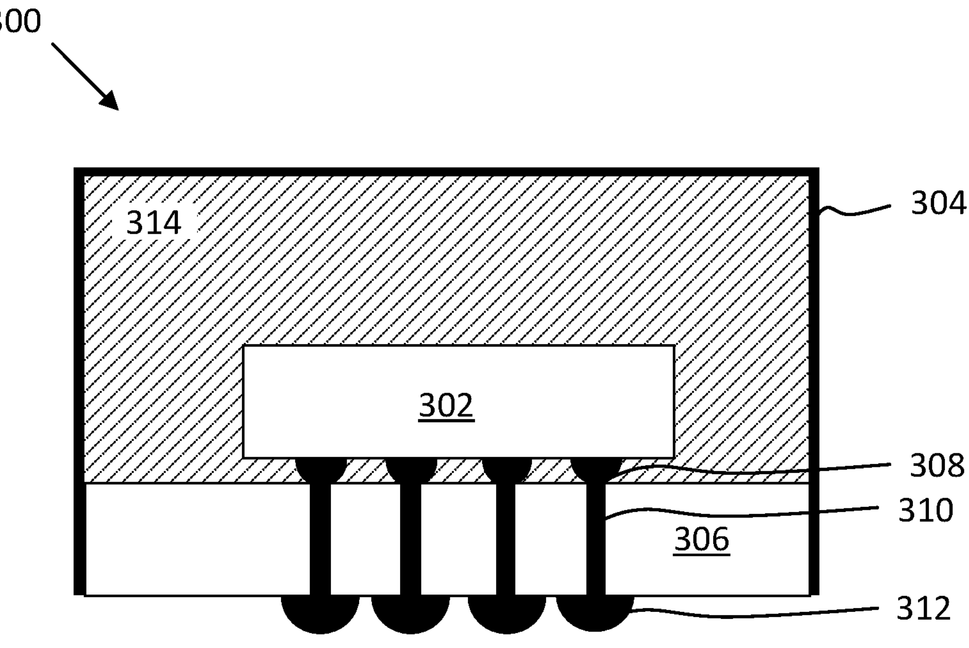
FIG. 3 illustrates a cross-section view of a chip package containing one or more semiconductor dies, in accordance with some embodiments of the present disclosure.

FIG. 3 illustrates an example embodiment of a chip package 300. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and provides, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
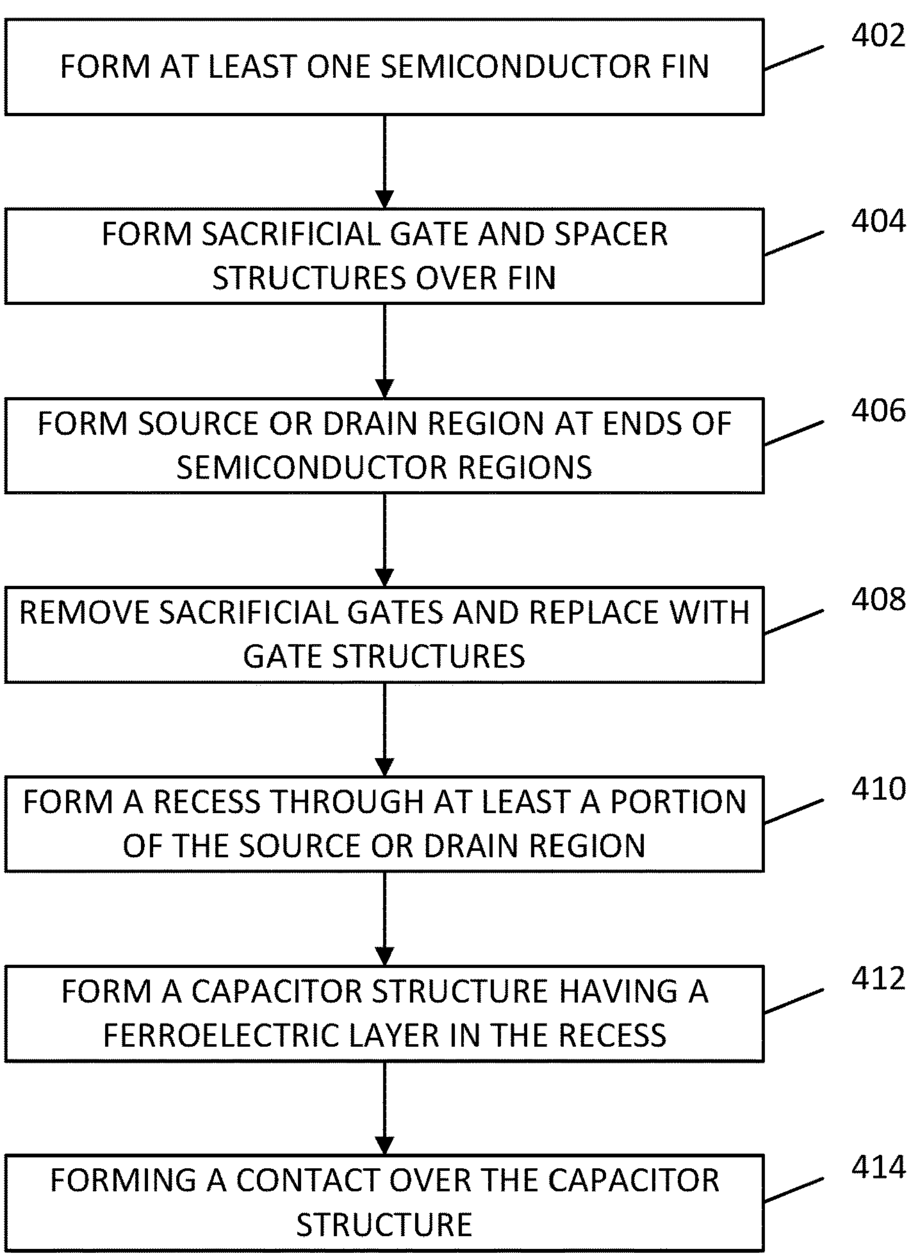
FIG. 4 is a flowchart of a fabrication process for a semiconductor device having a capacitor integrated with the source or drain region of the semiconductor device, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2N. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. Some of the operations of method 400 may be performed in a different order than the illustrated order.

Method 400 begins with operation 402 where at least one semiconductor fin is formed, according to some embodiments. The semiconductor material in the one or more fins may be formed from a substrate such that the one or more fins are an integral part of the substrate (e.g., etched from a bulk silicon substrate). Alternatively, the one or more fins can be formed of material deposited onto an underlying substrate. In one such example case, a blanket layer of silicon germanium (SiGe) can be deposited onto a silicon substrate, and then patterned and etched to form one or more SiGe fins extending from that substrate. In another such example, the one or more fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into one or more fins or deposited into fin-shaped trenches. The one or more fins may also include a cap structure over each fin that is used to define the locations of the fins during, for example, an RIE process. The cap structure may be a dielectric material, such as silicon nitride.

According to some embodiments, a dielectric fill is formed around subfin portions of the one or more fins. In some embodiments, the dielectric fill extends between each pair of adjacent parallel fins and runs lengthwise in the same direction as the one or more fins. In some embodiments, the anisotropic etching process that forms the one or more fins also etches into a portion of the substrate and the dielectric fill may be formed within the recessed portions of the substrate. Accordingly, the dielectric fill acts as shallow trench isolation (STI) between adjacent fins. The dielectric fill may be any suitable dielectric material, such as silicon oxide.

Method 400 continues with operation 404 where a sacrificial gate and spacer structures are formed over at least one of the fins. The sacrificial gate may be patterned using a gate masking layer in a strip that runs orthogonally over the fins (many gate masking layers, and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 400 continues with operation 406 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions.

Method 400 continues with operation 408 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples.

Method 400 continues with operation 410 where a recess is formed through at least a portion of the source or drain region. The recess may extend below a bottom surface of the source or drain region, such that recess extends into the underlying substrate. According to some embodiments, a sidewall of the source or drain region is exposed along a side of the recess. An anisotropic RIE process may be formed to form the recess.

Method 400 continues with operation 412 where a capacitor structure is formed within the recess. According to some embodiments, the capacitor is a ferroelectric capacitor having a ferroelectric layer between an outer electrode and an inner electrode. Each of the two electrodes may be formed within the recess, such that the outer electrode contacts at least a portion of the source or drain region. Further details regarding the fabrication of the capacitor structure are provided with reference to FIG. 5.

Method 400 continues with operation 414 where a conductive contact is formed over the capacitor structure. According to some embodiments, the conductive contact directly contacts at least the inner electrode of the capacitor structure. Recall from above that the outer electrode can be recessed downward to avoid possible short-circuiting with the contact on the inner electrode, thus improving process margin for the contact process.

Figure 5:
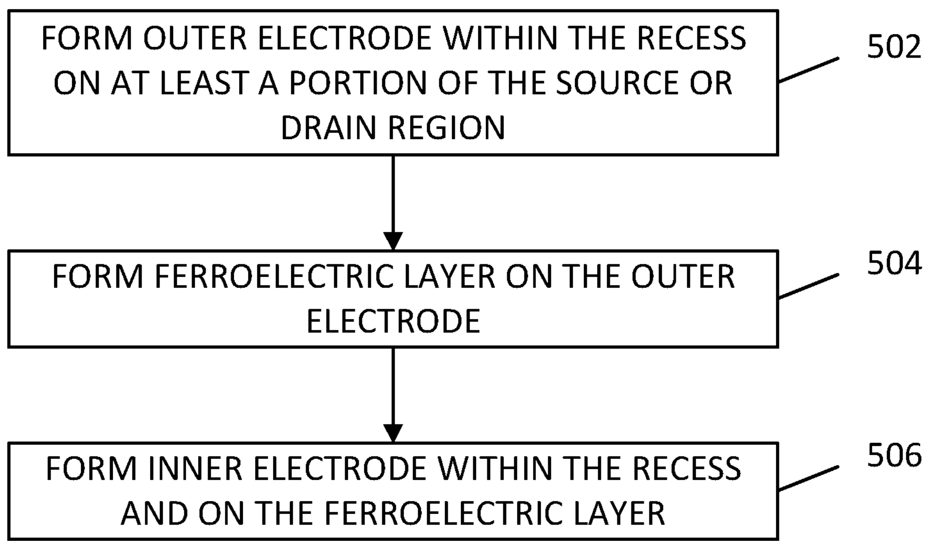
FIG. 5 is a flowchart of a more detailed fabrication process for the capacitor integrated with the source or drain region of the semiconductor device, in accordance with an embodiment of the present disclosure.

FIG. 5 is a flow chart of a method 500 for forming a capacitor structure integrated with a source or drain region, according to an embodiment. Various operations of method 500 may be illustrated in the examples of FIGS. 2J-2N. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. Some of the operations of method 500 may be performed in a different order than the illustrated order.

Method 500 begins with operation 502 where an outer electrode is formed within the recess and on at least a portion of the source or drain region within the recess. In some embodiments, a conformal dielectric layer having thickness between about 3 nm and about 20 nm is first formed within the recess prior to the formation of the outer electrode within the recess to protect the outer electrode from contacting the underlying substrate (particularly when the underlying substrate is a semiconductor material). The outer electrode may be any suitable conductive material and may have a thickness between about 3 nm and about 20 nm. According to some embodiments, the outer electrode is patterned such that it does not extend on every surface within the recess, but just far enough along the sidewalls of the recess to contact a portion of the source or drain region. Accordingly, an etch-back process using a sacrificial fill material (e.g., CHM), as discussed above, may be used to pattern the outer electrode along only a portion of the total height of the recess.

Method 500 continues with operation 504 where a ferroelectric layer is formed on the outer electrode within the recess. The ferroelectric layer may be formed directly on the outer electrode, and also on any other exposed surfaces within the recess, such as on any other exposed surfaces of the source or drain region. The ferroelectric layer may be, for example, hafnium oxide ($HfO_2$) doped with any one or more of silicon, zirconium, aluminum, or scandium. Any other ferroelectric materials can be used as well. The ferroelectric layer may have a thickness between about 3 nm and about 20 nm. According to some embodiments, the ferroelectric layer may be patterned such that it remains only along the exposed surfaces within the recess and is removed anywhere else outside of the recess.

Method 500 continues with operation 506 where an inner electrode is formed within the recess and on the ferroelectric layer. The inner electrode may include the same conductive material as the outer electrode, although any other suitable conductive material may be used as well. According to some embodiments, the inner electrode may fill a large portion of the remaining volume of the recess. In some embodiments, a top surface of the inner electrode is at the same height as or above a top surface of the outer electrode within the recess. According to some embodiments, the inner electrode is deposited to fill the remaining volume of the recess and is then recessed back to its final height.

Example System

Figure 6:
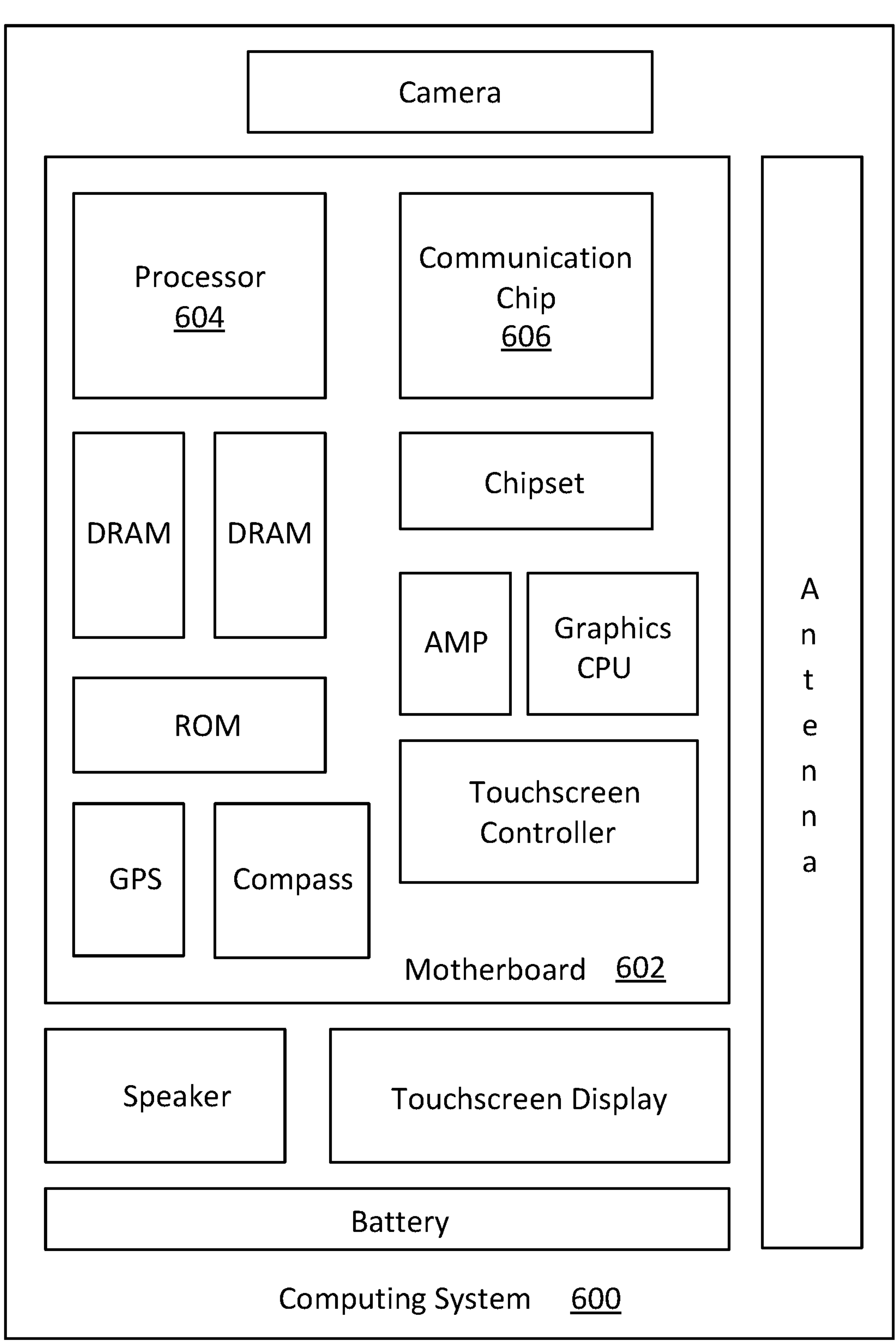
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit device on a substrate, the substrate having one or more semiconductor devices with a capacitor structure integrated with the source or drain region). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit including a semiconductor region over a substrate and extending in a first direction from a first source or drain region to a second source or drain region, a gate structure extending in a second direction over the semiconductor region, a capacitor structure having a first electrode, a second electrode, and a ferroelectric layer between the first and second electrodes, and a conductive contact over the capacitor structure. The first electrode directly contacts the first source or drain region and the second electrode directly contacts the conductive contact.

Example 2 includes the integrated circuit of Example 1, wherein the semiconductor region comprises a plurality of semiconductor nanoribbons.

Example 3 includes the integrated circuit of Example 2, wherein the plurality of semiconductor nanoribbons comprise germanium, silicon, or a combination thereof.

Example 4 includes the integrated circuit of any one of Examples 1-3, wherein the capacitor structure extends into the substrate below a bottom surface of the first source or drain region.

Example 5 includes the integrated circuit of any one of Examples 1-4, further comprising a fin isolation structure adjacent to the capacitor structure.

Example 6 includes the integrated circuit of Example 5, wherein the first electrode directly contacts the fin isolation structure.

Example 7 includes the integrated circuit of Example 5 or 6, wherein the ferroelectric layer directly contacts the fin isolation structure.

Example 8 includes the integrated circuit of any one of Examples 1-7, wherein the ferroelectric layer comprises oxygen and hafnium.

Example 9 includes the integrated circuit of any one of Examples 1-8, further comprising a dielectric layer between the first electrode of the capacitor structure and a portion of the substrate beneath the first source or drain region.

Example 10 includes the integrated circuit of any one of Examples 1-9, wherein the capacitor structure and the first source or drain region both extend into the substrate beneath a bottom surface of the gate structure.

Example 11 is a printed circuit board comprising the integrated circuit of any one of Examples 1-10.

Example 12 is an electronic device that includes a chip package having one or more dies. At least one of the one or more dies includes a semiconductor device having a semiconductor region extending in a first direction from a first source or drain region to a second source or drain region, and a gate structure extending in a second direction over the semiconductor region, a capacitor structure having a first electrode, a second electrode, and a ferroelectric layer between the first and second electrodes, and a conductive contact over the capacitor structure. The first electrode directly contacts the first source or drain region and the second electrode directly contacts the conductive contact.

Example 13 includes the electronic device of Example 12, wherein the semiconductor region comprises a plurality of semiconductor nanoribbons.

Example 14 includes the electronic device of Example 13, wherein the plurality of semiconductor nanoribbons comprise germanium, silicon, or a combination thereof.

Example 15 includes the electronic device of any one of Examples 12-14, wherein the capacitor structure extends to a height that is greater than a height of the first source or drain region.

Example 16 includes the electronic device of any one of Examples 12-15, wherein the at least one of the one or more dies further comprises a fin isolation structure adjacent to the capacitor structure.

Example 17 includes the electronic device of Example 16, wherein the first electrode directly contacts the fin isolation structure.

Example 18 includes the electronic device of Example 16 or 17, wherein the ferroelectric layer directly contacts the fin isolation structure.

Example 19 includes the electronic device of any one of Examples 12-18, wherein the ferroelectric layer comprises oxygen and hafnium.

Example 20 includes the electronic device of any one of Examples 12-19, further comprising a dielectric layer between the first electrode of the capacitor structure and a substrate beneath the first source or drain region.

Example 21 includes the electronic device of any one of Examples 12-20, further comprising a printed circuit board, wherein the chip package is coupled to the printed circuit board.

Example 22 is a method of forming an integrated circuit. The method includes forming a fin comprising a semiconductor material, the fin extending above a substrate and extending in a first direction; forming a source or drain region at an end of the semiconductor material; forming a gate structure extending over the semiconductor material in a second direction different from the first direction; forming a recess through at least a portion of the source or drain region; forming a capacitor structure having a ferroelectric layer within the recess; and forming a conductive contact over the capacitor structure.

Example 23 includes the method of Example 22, wherein forming the source or drain region includes forming a sacrificial gate extending over the semiconductor material in the second direction; forming spacer structures on sidewalls of the sacrificial gate; removing portions of the fin not protected by the sacrificial gate and spacer structures; and forming the source or drain region at an exposed end of the semiconductor material from the fin beneath the sacrificial gate and spacer structures.

Example 24 includes the method of Example 22 or 23, wherein forming the capacitor structure includes forming a first electrode within the recess, such that the first electrode contacts at least a portion of the source or drain region; forming the ferroelectric layer on the first electrode in the recess; and forming a second electrode in the recess, wherein forming the conductive contact comprises forming the conductive contact on at least a portion of the second electrode.

Example 25 includes the method of any one of Examples 22-24, wherein the ferroelectric layer comprises oxygen and hafnium.

Example 26 includes the method of any one of Examples 22-25, further comprising forming a dielectric layer within the recess prior to forming the capacitor structure.

Example 27 includes the method of any one of Examples 22-26, wherein forming the recess comprises forming a recess that extends deeper than a total height of the source or drain region.

Example 28 is an integrated circuit that includes a semiconductor region over a substrate and extending in a first direction from a first source or drain region to a second source or drain region, a gate structure extending in a second direction over the semiconductor region, a first conductive layer contacting a sidewall portion of the first source or drain region, a ferroelectric layer on the first conductive layer, a second conductive layer on the ferroelectric layer, and a conductive contact on the second conductive layer.

Example 29 includes the integrated circuit of Example 28, wherein the semiconductor region comprises a plurality of semiconductor nanoribbons.

Example 30 includes the integrated circuit of Example 29, wherein the plurality of semiconductor nanoribbons comprise germanium, silicon, or a combination thereof.

Example 31 includes the integrated circuit of any one of Examples 28-30, wherein the first conductive layer extends into the substrate below a bottom surface of the first source or drain region.

Example 32 includes the integrated circuit of any one of Examples 28-31, further comprising a fin isolation structure adjacent to the first conductive layer.

Example 33 includes the integrated circuit of Example 32, wherein the first conductive layer directly contacts the fin isolation structure.

Example 34 includes the integrated circuit of Example 32 or 33, wherein the ferroelectric layer directly contacts the fin isolation structure.

Example 35 includes the integrated circuit of any one of Examples 28-34, wherein the ferroelectric layer comprises oxygen and hafnium.

Example 36 includes the integrated circuit of any one of Examples 28-35, further comprising a dielectric layer between the first conductive layer and a portion of the substrate beneath the first source or drain region.

Example 37 includes the integrated circuit of any one of Examples 28-36, wherein at least the first conductive layer and the first source or drain region extend into the substrate beneath a bottom surface of the gate structure.

Example 38 is a printed circuit board comprising the integrated circuit of any one of Examples 28-37.

Example 39 is an integrated circuit that includes a semiconductor region over a substrate and extending in a first direction from a first source or drain region to a second source or drain region, a gate structure extending in a second direction over the semiconductor region, a conductive layer on a top surface of the first source or drain region, a ferroelectric layer on the conductive layer, and a conductive contact on the ferroelectric layer.

Example 40 is the integrated circuit or electronic device of any one of Examples 1-21 or 28-39, wherein the conductive contact is a multilayer structure and/or the first source or drain region is a multilayer structure.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a semiconductor region over a substrate and extending in a first direction from a first source or drain region to a second source or drain region;

a gate structure extending in a second direction over the semiconductor region;

a capacitor structure having a first electrode, a second electrode, and a ferroelectric layer between the first and second electrodes; and a conductive contact over the capacitor structure;

wherein the first electrode directly contacts the first source or drain region, the second electrode directly contacts the conductive contact, and the ferroelectric layer directly contacts the first source or drain region.

2. The integrated circuit of claim 1, wherein the capacitor structure extends into the substrate below a bottom surface of the first source or drain region.

3. The integrated circuit of claim 1, further comprising a fin isolation structure adjacent to the capacitor structure.

4. The integrated circuit of claim 3, wherein the first electrode directly contacts the fin isolation structure.

5. The integrated circuit of claim 3, wherein the ferroelectric layer directly contacts the fin isolation structure.

6. The integrated circuit of claim 1, further comprising a dielectric layer between the first electrode of the capacitor structure and a portion of the substrate beneath the first source or drain region.

7. The integrated circuit of claim 1, wherein the capacitor structure and the first source or drain region both extend into the substrate beneath a bottom surface of the gate structure.

8. The integrated circuit of claim 1, wherein the conductive contact is a multilayer structure and/or the first source or drain region is a multilayer structure.

9. The integrated circuit of claim 1, wherein the ferroelectric layer comprises oxygen and hafnium.

10. A printed circuit board comprising the integrated circuit of claim 1.

11. An integrated circuit comprising:

a semiconductor region over a substrate and extending in a first direction from a first source or drain region to a second source or drain region;

a gate structure extending in a second direction over the semiconductor region;

a first conductive layer contacting a first sidewall portion of the first source or drain region;

a ferroelectric layer on the first conductive layer and contacting a second sidewall portion of the source or drain region;

a second conductive layer on the ferroelectric layer; and a conductive contact on the second conductive layer.

12. The integrated circuit of claim 11, wherein the first conductive layer extends into the substrate below a bottom surface of the first source or drain region.

13. The integrated circuit of claim 11, further comprising a fin isolation structure adjacent to the first conductive layer.

14. The integrated circuit of claim 13, wherein the first conductive layer directly contacts the fin isolation structure.

15. The integrated circuit of claim 13, wherein the ferroelectric layer directly contacts the fin isolation structure.

16. The integrated circuit of claim 11, further comprising a dielectric layer between the first conductive layer and a portion of the substrate beneath the first source or drain region.

17. The integrated circuit of claim 11, wherein at least the first conductive layer and the first source or drain region extend into the substrate beneath a bottom surface of the gate structure.

18. The integrated circuit of claim 11, wherein the conductive contact is a multilayer structure and/or the first source or drain region is a multilayer structure.

19. A printed circuit board comprising the integrated circuit of claim 11.

20. An integrated circuit comprising:

a semiconductor region over a substrate and extending in a first direction from a first source or drain region to a second source or drain region;

a gate structure extending in a second direction over the semiconductor region;

a dielectric spacer structure between the gate structure and the source or drain region along the first direction and directly contacting both the gate structure and the source or drain region;

a conductive layer directly on a top surface of the first source or drain region;

a ferroelectric layer on the conductive layer; and a conductive contact on the ferroelectric layer, wherein a top surface of the conductive contact is not above a top surface of the dielectric spacer structure.

* * * * *